(12) United States Patent
Yeh

(10) Patent No.: US 6,794,274 B2
(45) Date of Patent: Sep. 21, 2004

(54) METHOD FOR FABRICATING A POLYCRYSTALLINE SILICON FILM

(76) Inventor: Wen-Chang Yeh, 5F-5, No. 2, Lane 87, Chienkwo Rd., Taichung (TW)

( * ) Notice: Subject to any disclaimer, the term of this patent is extended or adjusted under 35 U.S.C. 154(b) by 160 days.

(21) Appl. No.: 10/026,989

(22) Filed: Dec. 19, 2001

(65) Prior Publication Data

US 2002/0142565 A1 Oct. 3, 2002

(30) Foreign Application Priority Data

Apr. 3, 2001 (JP) ........................................ 2001-140731

(51) Int. Cl.⁷ .......................... H01L 21/20; H01L 21/36
(52) U.S. Cl. ...................... 438/485; 438/486; 438/487; 438/488
(58) Field of Search ................. 438/486, 485, 438/487, 488, 150, 96, 97

(56) References Cited

U.S. PATENT DOCUMENTS

| | | | | |
|---|---|---|---|---|
| 5,529,937 A | * | 6/1996 | Zhang et al. ............... 437/710 |
| 5,569,610 A | * | 10/1996 | Zhang et al. ............... 437/21 |
| 5,693,541 A | * | 12/1997 | Yamazaki et al. ........... 437/21 |
| 5,756,364 A | * | 5/1998 | Tanaka et al. ............... 437/21 |
| 5,796,116 A | * | 8/1998 | Nakata et al. ............... 257/66 |
| 5,817,548 A | * | 10/1998 | Noguchi et al. ............. 438/160 |
| 5,827,773 A | * | 10/1998 | Voutsas ...................... 438/488 |
| 5,920,772 A | * | 7/1999 | Lin ............................ 438/158 |
| 5,943,593 A | * | 8/1999 | Noguchi et al. ............. 438/487 |
| 6,165,810 A | * | 12/2000 | Morimoto .................... 438/30 |
| 6,169,013 B1 | * | 1/2001 | Voutsas ...................... 438/485 |

\* cited by examiner

Primary Examiner—Long Pham
Assistant Examiner—Shrinivas Hrao
(74) Attorney, Agent, or Firm—J.C. Patents

(57) ABSTRACT

A method for fabricating polycrystalline silicon film on a substrate adds a semitransparent film between the substrate and the silicon film. When the laser irradiates the silicon film, the semitransparent film absorbs a portion of the laser energy, and the semitransparent film is kept at a high temperature during solidification of the silicon film. The silicon film will be kept in a molten state for a long time. Therefore, more time is available for crystal grain growth. The crystal grain size of the polycrystalline silicon film in this method is much larger than the size in normal substrate heating methods.

6 Claims, 2 Drawing Sheets

METHOD FOR FABRICATING A POLYCRYSTALLINE SILICON FILM

BACKGROUND OF THE INVENTION

1. Field of the Invention

The present invention relates to a method of fabricating a polycrystalline silicon film and more particularly to a method that uses a laser annealing process and has a larger crystal grain size of a polycrystalline silicon film than normal.

2. Description of Related Art

The major material used in semiconductors is silicon, and many forms of silicon are used, such as amorphous, polycrystalline and single crystalline silicon. Polycrystalline silicon thin film has recently attracted considerable attention due to its special physical features and low cost. Consequently, companies fabricating thin film transistor liquid crystal displays (TFT-LCD), TFT-Organic Light Emitting Displays (TFT-OLED) or silicon solar cells are interested in developments of this material.

Polycrystalline silicon is an aggregate of single crystal grains, and thus there are many grain boundaries between crystal grains. These grain boundaries are a scattering source for a carrier. Therefore, enlargement of crystal grain size is very important for high performance devices. The conventional methods of fabricating typical polycrystalline silicon film follow.

1. Solid phase crystallization (SPC).
2. Vapor phase deposition (VPD).
3. Laser annealing.

In the SPC and VPD methods, the crystal grain size is as small as 100 nm. Therefore, the electrical performance of the resultant poly-Si film is poor. In the laser annealing method, an excimer laser is a most typical light source due to its high light energy density. In the excimer laser annealing (ELA) method, an intense light beam of an ultra-short duration can heat the precursor silicon film up to its melting point to be crystallized during its solidification process while keeping the non-heat-resistant glass or plastic substrate at sufficiently low temperatures. Therefore, good electrical properties are expected in ELA fabricated poly-Si film because of its high process temperature for Si film. However, the drawback of the ELA method is that the crystal grain size is smaller than 0.3 $\mu$m in a 100 nm-thick silicon film.

In the ELA method, the silicon film is melted by laser light, and then the silicon crystallizes during its solidification process. The longer the melt duration is, the larger crystal grain size is. If thermal flow from the molten silicon to the substrate can be suppressed, the crystal grain size can be enlarged. Several techniques are available to keep the heat in the molten silicon, such as supplying a low specific heat film between the silicon film and the substrate (W. Yeh et. al., Jpn. J. Appl. Phys., 38 (1999) L110) or heating the substrate to decrease the temperature gradient between the subtrate and the silicon film to slow down the heat flow (H. Kuriyama et. al. Jpn. J. Appl. Phys., 30 (1991) 3700; J. S. Im et al., Appl. Phys. Lett. 64 (1994) 2303). Materials with sufficiently lo specific heat are porous materials, but porous materials are not only difficult to fabricate but also have low alkali-resistance and/or acid-resistance. Therefore, porous film is usually destroyed in the back end processes for fabrication of devices.

To increase the grain size of silicon film in the ELA method, heating the substrate seems better for improving the large crystal grain size. The crystal grain size in ELA with 800° C. substrate heating is two times larger than the crystal grain size at room temperature. However, the temperature in the substrate heating technique is restricted by the strain temperature of the substrate material. For example, 500° C. is the upper limit for a glass substrate, and 150° C. is the upper limit for a plastic substrate. The effect of substrate heating on crystal grain size at these temperatures is slight.

To overcome the shortcomings, the present invention provides a method to fabricate silicon film with large crystal grain size to mitigate and obviate the aforementioned problems.

SUMMARY OF THE INVENTION

The main objective of the present invention is to provide a method for fabricating a polycrystalline silicon film with large crystal grains.

Other objectives, advantages, and novel features of the invention will become more apparent from the following detailed description when taken in conjunction with the accompanying drawings.

DETAILED DESCRIPTION OF THE PREFERRED EMBODIMENT

Figure 1:
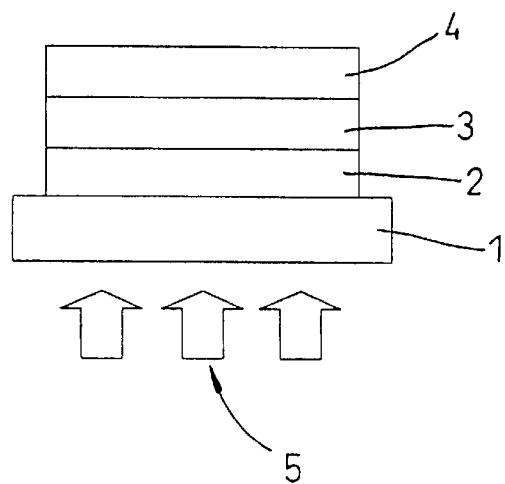
FIG. 1 is a side plan view of silicon film and a substrate fabricated by the method in accordance with present invention.

With reference to FIG. 1, a method for fabricating a polycrystalline silicon film on a transparent substrate (1) with a top and a bottom comprises the following steps:

applying a semitransparent film (2) on a top surface of the glass substrate (1), wherein a SiOxNyCz compound included N, O, C and Si elements fabricated by a Radio Frequency Plasma Enhanced Chemical Vapor Deposition (RF-PECVD), and the semitransparent film (2) has a thickness of 800 nm and has a 0~40000 cm$^{-1}$ absorption coefficient for 248~351 nm wavelength.

applying a buffer film (3) on the semitransparent film (2) wherein the $SiO_2$ is used as a buffer film (3) and $SiO_2$ is deposited by RF-PECVD on the semitransparent film (2) and is about 100 nm thick; and applying an amorphous silicon film (4) on the buffer film (3) by Low Pressure Chemical Vapor Deposition (LPCVD) using $Si_2H_6$ gas at 500° C. and the thickness of the amorphous silicon film (4) is 100 nm; and irradiating the semitransparent film (2) and the amorphous silicon film (4) with laser light (5) to crystallize the amorphous silicon film (4) at room temperature, wherein there are many ways to heat the semitransparent film (2) such as applying a single pulse of XeF excimer laser light (5) from the bottom of the substrate (1) in the semitransparent film (2) and amorphous silicon film (4).

The absorption coefficient of the semitransparent film (2) was measured from the transmittance and the reflectance of the semitransparent film (2) on a quartz substrate by a spectrophotometer, and the absorption coefficient of the quartz substrate in the range of wavelength is defined as 0 cm$^{-1}$. The crystal grain size was measured by a scanning electron microscope after Secco-etching of the polycrystalline silicon film (4).

Figure 2:
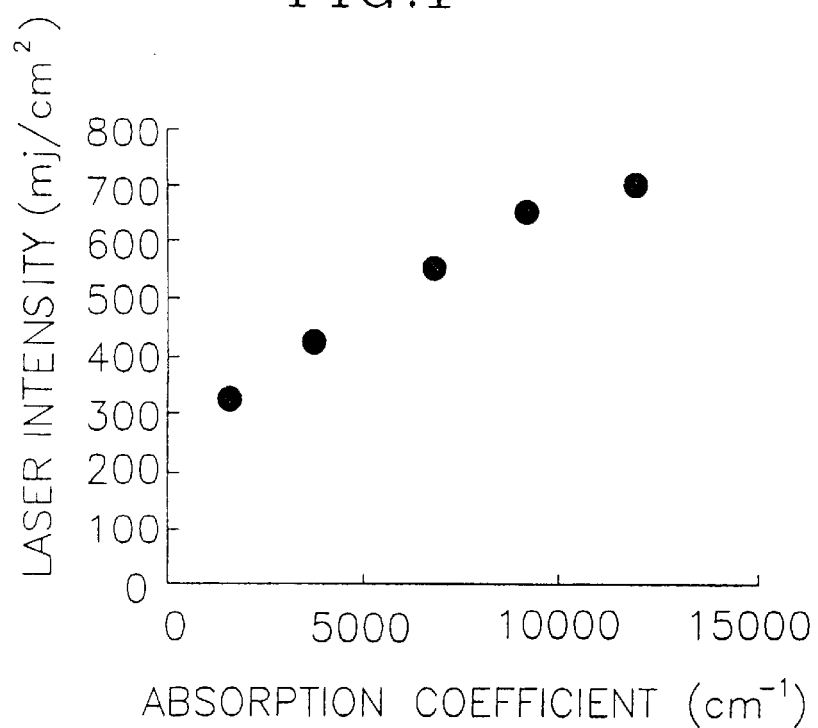
FIG. 2 is a graph of the threshold laser intensity for the complete melting of the silicon film versus the absorption coefficient of the semitransparent film.

With reference to FIG. 2, the threshold laser intensity increased as the absorption coefficient increased. Since the energy to melt the silicon film is the same in all the samples, the surplus laser energy should have bee absorbed by the semitransparent film (2) and converted to heat. The higher the absorption coefficient, the more laser energy the semitransparent film (2) absorbs, and therefore, the higher the temperature of the semitransparent film (2). When the laser intensity was above the maximum permissible laser intensity, 700 mJcm$^{-2}$, for the semitransparent film (2), the semitransparent film (2) peeled off.

Figure 3:
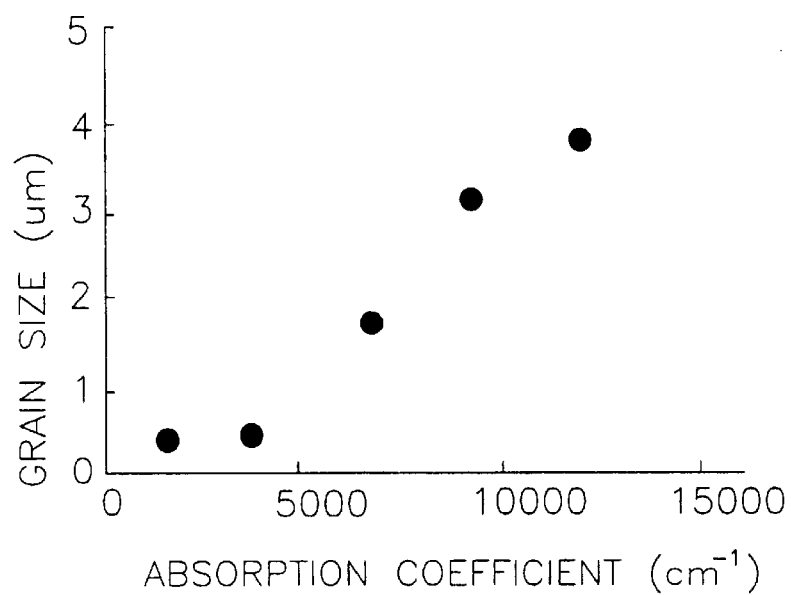
FIG. 3 is a graph of the crystal grain size versus the absorption coefficient of the semitransparent film.

With reference to FIG. 3, the crystal grain size is a function of the absorption coefficient of the semitransparent film (2), which ranges from 0 cm$^{-1}$ to 12000 cm$^{-1}$. The crystal grain is essentially a disk with a thickness of the thickness of the silicon film. The crystal grain size is defined as the radius of the disk obtained under a near complete melting condition of the silicon film. As described by J. S. Im et al., Appl. Phys. Lett. 64(1994)2303, the crystal grain size is almost constant for absorption coefficients less than 4000 cm$^{-1}$, but increases dramatically as the absorption coefficient increases above 4000 cm$^{-1}$. The crystal grain size is maximum at 3.8 μm when the absorption coefficient is 12000 cm$^{-1}$. This is 10 times larger than the size with an absorption coefficient of 0 cm$^{-1}$, and is even larger than the substrate heating method (radius is 0.9 μm at 600□) (J. S. Im et al., Appl. Phys. Lett. 64(1994)2303). The relationship of the crystal grain size to the absorption coefficient is also valid when a KrF excimer laser light source is used with quartz as the substrate, which means there is no dependence on laser wavelength in this method. With reference to FIG. 3, the absorption coefficient needs to be more than 4000 cm$^{-1}$.

Figure 4:
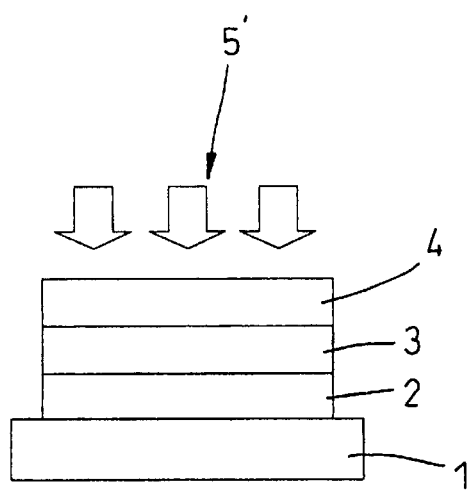
FIG. 4 is a side plan view of th silicon film and the substrate fabricated by another embodiment of the method in accordance with the present invention.

In compliance with the foregoing description, laser fight (5) with a wavelength for which the silicon film (4) is semitransparent can also be applied from the top of the silicon film (4) instead of the bottom of the substrate (1), as shown in FIG. 4 and FIG. 1. The laser light (5) energy can also be absorbed by both the silicon film (4) and the semitransparent film (2).

The semitransparent film peel off when the laser intensity is greater than 700 mJcm$^{-2}$ at an absorption coefficient greater than 12000 cm$^{-1}$. The maximum permissible laser intensity for the semitransparent film is related to the resistant temperature of the semitransparent film. Therefore, more heat resistant materials can be used as the semitransparent film, and if the laser intensity can be increased by using more heat resistant material, the crystal grain size can be increased further.

SiOxCy is a candidate material for the semitransparent film (2) because of its high thermal stability. Arranging the atom ratio between O and C can vary the absorption coefficient.

A SiOx compound is another candidate material for the semitransparent film (2). When the silicon atom occupies more than 33 percent of the SiOx compound, the SiOx compound becomes a film that will absorb light. When the quantity of silicon atoms in the SiOx compound changes, the absorption coefficient the SiOx compound changes. Many other heat resistant materials with appropriate absorption coefficients can be used as the semitransparent film (2).

Increasing the maximum laser intensity applied to the semitransparent film (2) further increases the crystal grain size. For a homogeneous absorption coefficient through the semitransparent film (2) along the depth direction, the temperature will be higher at the side on which the laser light is incident and lower at the side through which the laser light exits. To increase the maximum laser intensity applied to the semitransparent film, arranging the absorption coefficient along the depth direction to standardize the temperature in the depth direction is also useful. With reference to FIG. 1, the absorption coefficient of the semitransparent film (2) near the substrate (1) can be lower than that near the silicon film (4) to standardize the temperature in the semitransparent film.

With the absorption coefficient as described above, the semitransparent film absorbs a portion of the laser energy during laser annealing, thus the semitransparent film is kept at a high temperature during crystallization of the silicon film. The crystal grain size of the silicon film in the present method carried out at room temperature is much larger than the size using normal substrate heating methods. Therefore, with the present method less equipment than normal is required during the laser annealing process, and non heat-resistant materials such as plastic can also be used as the substrate.

Although the present invention has been explained in relation to its preferred embodiment, it is to be understood that many other possible modifications and variations can be made without departing from the spirit and scope of the invention as hereinafter claimed.

What is claimed is:

1. A method for fabricating polycrystalline silicon film, comprising:

forming a semitransparent film over a substrate;

forming a buffer layer over the semitransparent film;

forming a silicon film over the buffer layer; and performing a laser annealing process by applying a laser beam on the silicon film through the semitransparent film, wherein the silicon film is re-crystallized into a crystalline silicon film, wherein the semitransparent film absorbs a portion of energy of the laser beam and converts the energy into heat, so as to grow silicon grains of the crystalline silicon film in a larger grain size.

2. The method as recited in claim 1, wherein the silicon film includes amorphous silicon.

3. The method as recited in claim 1, further comprising forming a capping layer over the silicon film.

4. A method for fabricating polycrystalline silicon film, comprising:

forming a semitransparent film over a substrate;

forming a buffer layer over the semitransparent film;

forming a silicon film over the buffer layer; and performing a laser annealing process by applying a laser beam through the silicon film and then the semitransparent film, wherein the silicon film is recrystallized into a crystalline silicon film, wherein the semitransparent film absorbs a portion of energy of the laser beam and converts the energy into heat, so as to grow silicon grains of the crystalline silicon film in a larger grain size.

5. The method as recited in claim 4, wherein the silicon film includes amorphous silicon.

6. The method as recited in claim 4, further comprising forming a capping layer over the silicon film.

\* \* \* \* \*